(12) United States Patent
Monge

(10) Patent No.: US 7,146,150 B2
(45) Date of Patent: Dec. 5, 2006

(54) MIXING CIRCUIT WITH LOW NOISE FACTOR WHEN OPERATING AT LOW FREQUENCY

(75) Inventor: Laurent Monge, Caen (FR)

(73) Assignee: NXP B.V., Eindhoven (NL)

( * ) Notice: Subject to any disclaimer, the term of this patent is extended or adjusted under 35 U.S.C. 154(b) by 515 days.

(21) Appl. No.: 10/253,261

(22) Filed: Sep. 24, 2002

(65) Prior Publication Data
US 2003/0078026 A1  Apr. 24, 2003

(30) Foreign Application Priority Data
Sep. 28, 2001  (FR) .................................. 01 12509

(51) Int. Cl.
*H04B 1/26* (2006.01)
(52) U.S. Cl. ...................... 455/323; 327/113; 455/324
(58) Field of Classification Search ................ 455/323, 455/324; 327/113
See application file for complete search history.

(56) References Cited

U.S. PATENT DOCUMENTS

| | | | | |
|---|---|---|---|---|
| 4,628,518 A * | 12/1986 | Chadwick et al. | .......... | 375/334 |
| 4,958,638 A * | 9/1990 | Sharpe et al. | ................ | 600/407 |
| 5,241,702 A * | 8/1993 | Dent | ...................... | 455/278.1 |
| 5,644,260 A * | 7/1997 | DaSilva et al. | ............. | 327/238 |
| 5,694,093 A * | 12/1997 | DaSilva et al. | ............. | 332/103 |
| 6,072,947 A * | 6/2000 | Roychowdhury et al. | ..... | 703/14 |
| 6,844,780 B1 * | 1/2005 | Miyagi | ....................... | 330/141 |
| 2003/0017816 A1 * | 1/2003 | Souetinov | ................... | 455/323 |
| 2003/0228860 A1 * | 12/2003 | Jou | ............................. | 455/324 |

FOREIGN PATENT DOCUMENTS

EP    0232560 B1    8/1987

OTHER PUBLICATIONS

K. Negus; "3.3V GPS Receiver MMIC Implemented on a Mixed Signal Silicon Bipolar Array", 1992 IEEE International Microwave Symposium Digest, vol. 2, Jun. 01, 1992, pp. 1071-1074, XP0003434790.
D. Boewers; "Minimizing Noise in Analog Bipolar Circuit Design", IEEE: Proceedings of the Bipolar Circuits Technology Meeting, Sep. 18, 1989, XP010089296.

* cited by examiner

*Primary Examiner*—Matthew Anderson
*Assistant Examiner*—Minh Dao

(57) ABSTRACT

The invention relates to a mixing circuit for mixing a first signal RF with a second signal LO including a conversion stage T3 to convert the first signal RF into a current, a mixing core T1 and T2 to mix said current with the second signal LO, said mixing core being loaded via at least one load element ZC. Said circuit includes noise optimization means taking into account the contribution of the load element or elements ZC to the noise inversely proportional to the frequency that is present in the output signal. In particular the load elements can be selected from inductive resistors or silicon resistors or be constituted by resistors of a size selected to optimize the noise inversely proportional to frequency.

Figure 1:
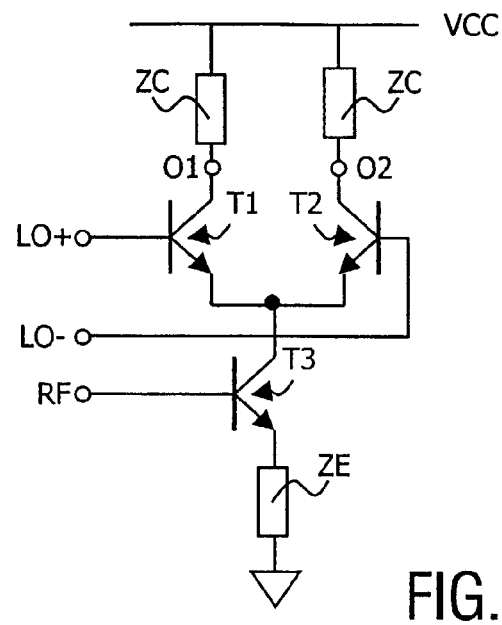

The invention allows the production of mixers with very good performance at low frequency via a simple microelectronic process of resistor forming.

9 Claims, 2 Drawing Sheets

MIXING CIRCUIT WITH LOW NOISE FACTOR WHEN OPERATING AT LOW FREQUENCY

DESCRIPTION

The invention relates to a mixing circuit for mixing a first signal with a second signal including a conversion stage to convert the first signal into a current, a mixing core to mix said current into the second signal, said mixing core being controlled via at least one load resistor, said circuit including means for noise optimization.

The invention more generally relates to the area of analog circuits for signal processing, in particular telecommunications and radio communications.

Such a mixing circuit is known from patent EP0232560. The circuit includes two transistors linked to load resistors and a conversion circuit from power to current, the output from the conversion circuit being linked to the transistor emitters. The noise optimization means include a shunt passage produced by a resistor in one embodiment. This shunt passage allows noise to be minimized by absorption of part thereof in the resistor.

The invention takes into account the fact that the circuit in the present state of the art has a high noise inversely proportional to the frequency present in the output signal, referred to below as 1/f noise, which is a problem when the frequency of the output signal is low. This is particularly disruptive when the amplification of the signal is mainly performed after mixing, when the signal is converted directly into a base band by a single mixing circuit etc. Problems can also be seen in the systems using a narrow modulation band.

One object of the invention is thus to minimize selectively the 1/f noise. In fact a circuit in accordance with the introductory paragraph is characterized according to the invention in that the noise optimization means take into account the contribution of the load element or elements to the 1/f noise.

In an advantageous embodiment said noise optimization means include means to diminish the 1/f noise implemented within the load element or, where applicable, elements.

In a first preferred embodiment the load elements are selected from elements of the group constituted by silicon resistors and inductive resistors.

In a second preferred embodiment at least one load element of the mixing core is a resistor with a size calculated to diminish the 1/f noise.

In particular the size of the load resistor can advantageously be calculated such that the length-to-width ratio is constant.

In practice, the present invention relates to any signal mixer in which load resistors are required. In particular all mixers using transistors are concerned. In fact such mixers necessitate load resistors to put the transistors into an operation area and achieve a current-voltage conversion at the mixer output. In particular mixers with a differential structure are covered by the invention: e.g. Gilbert cell . . . . Mixers are used in signal processing devices in which frequency translations are performed: cordless phone, DECT type phone, mobile phone, satellite receiver . . . . The invention also relates to such signal processing apparatus where the signal processing can be performed on reception, on transmission or at any time when necessary.

These and other aspects of the invention are apparent from and will be elucidated with reference to the embodiments described hereinafter.

Figure 2:
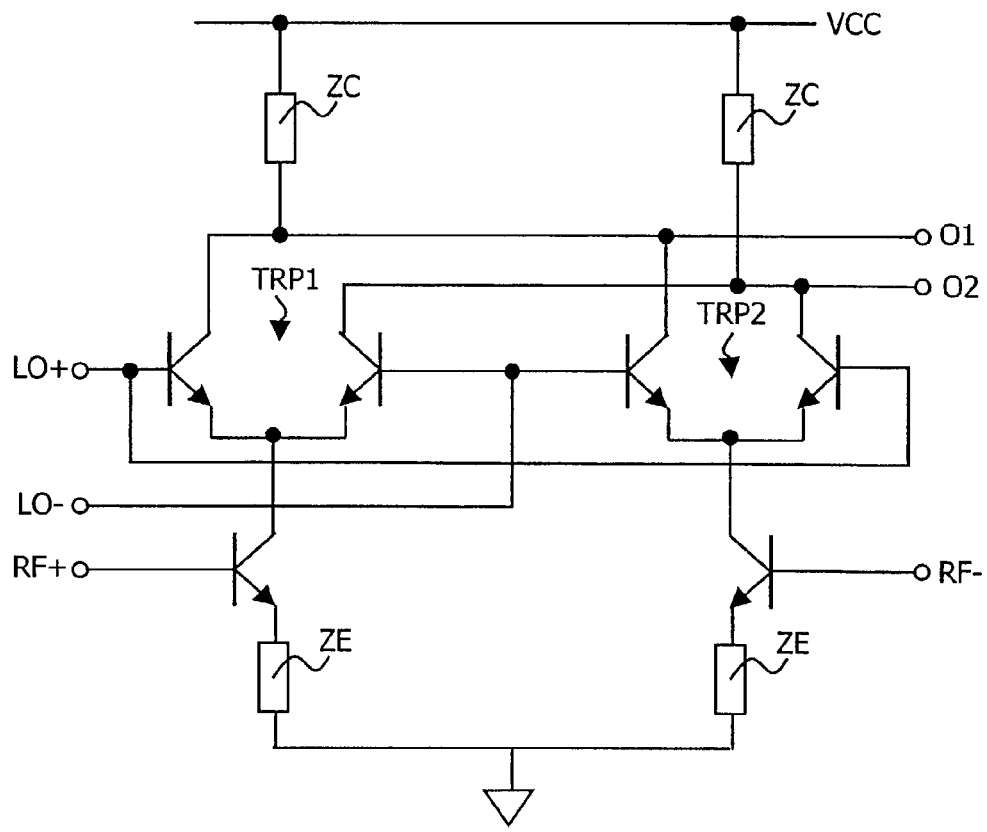
Figure 3:
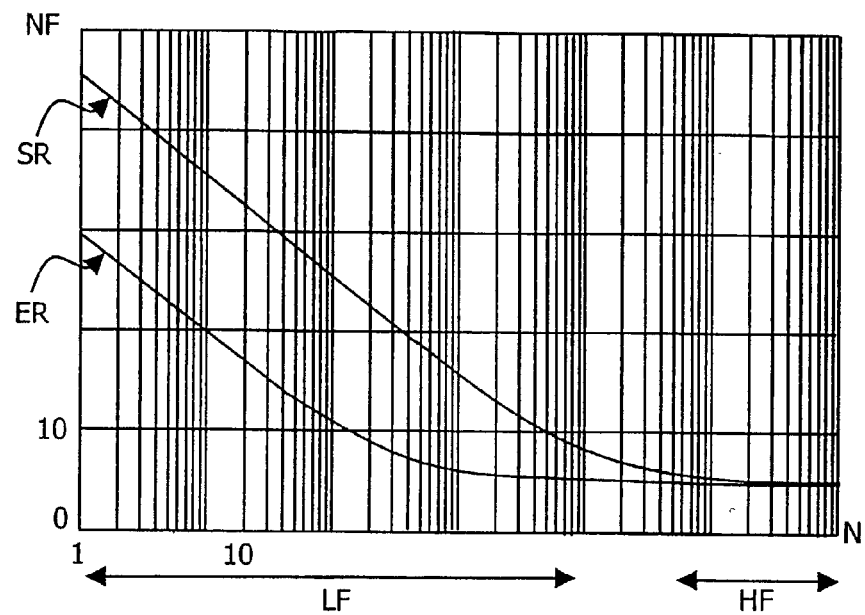
Figure 4:
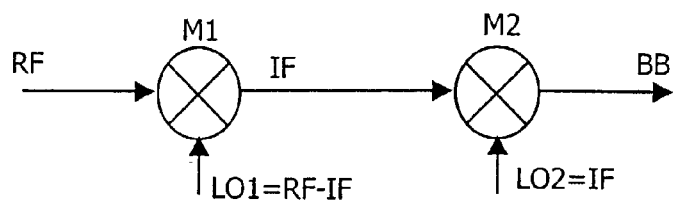
Figure 5:
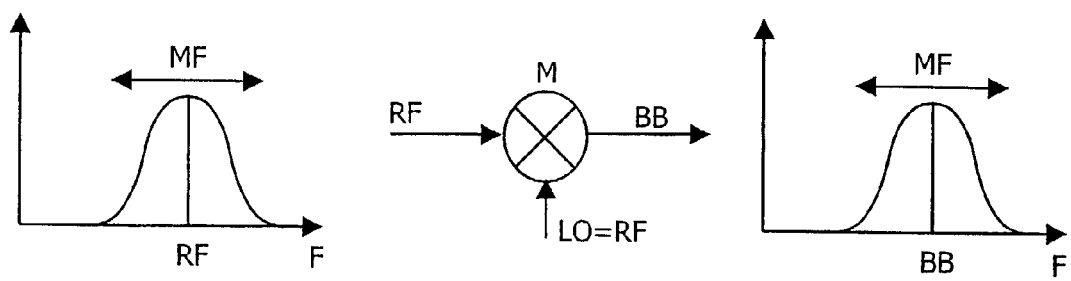

In the drawings,

FIG. 1 is a diagram of a mixing circuit according to the state of the art in which the invention can advantageously be used, FIG. 2 is a diagram of a particular mixing circuit with a differential structure in which the invention has proved highly advantageous, FIG. 3 shows the effect of the invention on 1/f noise, FIG. 4 is a diagram of an intermediate frequency receiver, FIG. 5 shows the operation of a receiver with zero intermediate frequency.

Mixers with low performance in low frequency noise often degrade the sensitivity of the system by adding noise to the signal. This noise is essentially 1/f noise. This noise exists in all active components and in certain passive components. The origin of this noise varies but mainly it is caused by traps associated with contamination and crystal defects. In general this noise is not taken into account in conventional mixing structures. It is considered inherent in the structure itself which in fact comprises active components for which such noise is inevitable. The invention is based on the discovery that the main contributors can be the load elements and in particular the resistors currently used for transistor loading. In fact according to the invention noise optimization means take into account the contribution of the load element or, where applicable, elements to the 1/f noise.

FIGS. 1 and 2 are diagrams of mixing circuits commonly used. FIG. 1 shows a simple circuit which has the drawback of having at the output (O1, O2) a large part of the signal LO. FIG. 2 has a differential structure which mitigates the drawbacks of the first structure, where the influence of the LO signal is suppressed because of the differential structure of the circuit. The mixing structure of FIG. 2 is well known as a Gilbert cell. The invention is advantageously used in each of these two assemblies according to an advantageous embodiment, where the noise optimization means include means to diminish the 1/f noise within the load element or elements. These assemblies will now be described.

The mixing circuit in FIG. 1 includes a transistor T3 achieving a conversion of a power signal RF into current and two transistors T1 and T2 mixing the current supplied by transistor T3 and signals LO+ and LO− supplied in a differential manner to each of transistors T1 and T2. Conventionally the two transistors are loaded by two impedances ZC not optimized for 1/f noise. Said impedances are linked to a fixed voltage VCC allowing transistor loading. In the case where the circuit in FIG. 1 must operate at low output frequencies, the signal can be sensitive to 1/f noise at the output, which diminishes the performance of the mixing circuit. Secondly this circuit does not function well at high power, as the polarization of the transistors does not allow it to remain in a linear field of operation of the mixer. In accordance with convention in the field of mixing, impedance ZE may be a simple resistor or an inductive resistor to achieve an inductive degeneration of transistor T3.

The mixing circuit in FIG. 2 includes two cells as described in FIG. 1 in parallel. This differential structure resolves the problem of the circuit in FIG. 1 at high power. It allows in fact recovery of the signal from one side or the other of the circuit even when high power harms the function of the two circuit sides. In this differential structure the power signal is supplied to the mixing circuit by two inputs in the form of two complementary signals RF+ and RF−. These signals are mixed using two pairs of transistors TRP1 and TRP2 into signal LO+ and LO−. The transistor pairs TRP1 and TRP2 are loaded via two load elements ZC and a voltage VCC. In the case where the circuit in FIG. 2 has to function at low output frequencies, the signal can be sensitive to 1/f noise at the output which diminishes the performance of the mixing circuit. It is known that transistors generate 1/f noise. The invention does not concern this inevitable noise but the 1/f noise generated by the load elements and the discovery that the contribution of these load elements to the noise is considerable.

FIG. 3 shows the effect of the invention on the 1/f noise. The graphs presented show the noise factor NF in dB as a function of the output frequency N of the mixer. Curve SR corresponds to a loading performed using standard load elements. These load elements are then selected as a function of traditional criteria of size and nature of load elements. In general, the rules for choosing the size of component are as follows. For transistors, the size is selected to allow the best frequency transition in accordance with the frequency of the input signal. For resistors the size is determined to give the best pairing between them. The pattern of the noise on the curve SR has two distinct main zones: a zone HF of minimum noise resulting from the thermal noise for high frequency and a region LF of 1/f noise which increases as the frequency diminishes and which is the noise of distribution or recombination. The 1/f noise is much greater in the case of curve SR. This noise comes from the transistors and—for a non-negligible proportion which the invention proposes to use—the characteristics of the load elements. The second curve ER is obtained for a circuit according to a second preferred embodiment described below in the description of the various embodiments of the invention. It is noted that the effect of the invention on the 1/f noise is considerable. The invention is based on the discovery of the influence of the load elements on these curves. This influence is due in particular to the granular structure of the conventional resistors of polysilicon, metal, etc.

In a first preferred embodiment the load elements are selected from elements of the group consisting of silicon resistors and inductive resistors. This solution should be considered when it is possible to use a silicon resistor or inductive resistor in the circuit. However, use of an inductive resistor is not always possible and a silicon resistor has the drawback of increasing the coupling of the mixer with the substrate.

In a second preferred embodiment at least one load element of the mixer core is a resistor of a size calculated to diminish the 1/f noise. In fact it is possible to improve the behavior of the load resistor towards the 1/f noise by enlarging the size of the load resistor(s). This solution most of the time has the advantage of requiring less space than an inductive resistor. In fact when the mixer output is at low frequency, the inductive resistor takes more space than an enlarged resistor according to the technology described below. According to the invention the size of a load resistor is selected following a new design criterion. This criterion consists of choosing a size which allows a contribution to the 1/f noise which is negligible in relation to that of the transistors. The behavior of a resistor gives an equivalent noise current $i_n$:

$$i_n^2 = \frac{\frac{K_F}{W \times L} \times I^{AF}}{f} + \frac{4kT}{R},$$

where AF is an exponent which could for example equal 2.

W and L are the width and length of the resistor, respectively. The first component represents the 1/f noise and the second the thermal noise. We see here that to diminish the 1/f noise we must increase the dimensions W and L. To choose a compromise between a size too large for the semi-conductor circuit requirements and the 1/f noise, a comparison is advantageously made with the 1/f noise generated by the transistor pairs of the mixer core which is expressed as:

$$i_n^2 = K_{ox} \times \frac{I_B^2}{f} + K_{iI \times} \frac{I_B}{f}.$$

This formula represents the equivalent noise current at the transistor input. By applying the transfer function between the transistor input and the mixer output (transfer function dependent on characteristics of signal LO), a direct comparison of the two sources of noise can be achieved to select the size for the resistor. The choice is made to retain a smaller contribution of the resistor to the 1/f noise than that of the transistors. The 1/f noise is therefore kept weak using a method of determining the component size.

However, it should be noted that the length to width ratio of the resistor affects the value of the resistor, where its value remains constant when the ratio is constant. In fact the resistance of a material follows the following rule:

R=ρL/S with S=exW, ρ being the resistivity, L the length, W the width and e the thickness. In microelectronics, a layer of a given thickness is deposited to achieve the resistance, hence ρ and e are constant. R is then directly proportional to L/W. It may be advantageous to modify the dimensions of this resistor so that the length-to-width ratio remains constant. In this case the value of the resistor does not change. Thus the thermal noise depending on the value of the resistor remains constant when the size of the resistor is modified while a constant length-to-width ratio is retained.

The 1/f noise is proportional to I/(W.L.f). The mixer must have a certain linear gain which sets the value of the resistance and the current. Only the values W and L can therefore be modified. Advantageously, these two values W and L are thus increased at the same time and in the same proportion, so that R is not modified but the 1/f noise is diminished. The example shown in FIG. 3 is achieved with the following resistance values:

|   | Curve SR: R standard | Curve ER: enlarged R |
| --- | --- | --- |
| R | 520 Ω | 520 Ω |
| W | 2 μm | 28 μm |
| L | 5.2 μm | 72.8 μm |

It is interesting to note that such resistors can easily be identified on an integrated circuit because their large size renders them highly visible. The process for producing such resistor sizes is common to the conventional microelectronic processes for forming resistors. However the drawback of this loss of space may be compensated by the very good function of the circuit. The 1/f noise can be a great handicap in certain assemblies and is easily resolved by this method.

This is the case for example of a direct mixing circuit which differs from conventional mixing circuits in that the mixing is performed directly in a single mixer and not in two successive mixers as shown on FIG. 4. The mixer in FIG. 4 is a classic mixing circuit consisting of two mixing stages M1 and M2 similar for example to those described with reference to FIG. 2. Thus the frequency translation is performed twice: frequency RF is first translated from RF to IF then from IF to the base band BB~0 Hz. The mixers use signals LO1=RF−IF and LO2=IF. This double mixing avoids the problems of 1/f noise as much as possible. The mixer M2 may appear sensitive to 1/f noise as its output is in the base band BB. However this mixer has an input in IF, intermediate frequency, and therefore needs less current. The 1/f noise is then negligible according to its equation in I/(W.L.f). The direct mixing circuit illustrated in FIG. 5 translates directly with a single mixer a frequency signal F=RF into a frequency signal F=BB using a frequency signal LO=RF. Here the intensity is high and set by the input frequency. A strong 1/f noise is observed here and the signal is generally drowned in this noise. The invention proves very useful in this case. The role of the resistor size is in fact revealed and utilized. The invention is very interesting with regard to the improvement of direct mixing circuits which are used more and more. These circuits in fact have the advantage of having one mixer less and hence a reduced complexity.

The invention is thus particularly interesting in the context of systems with high gain budget after mixing and in low band modulation systems. In fact firstly in systems with high budget gain after mixing, a good noise factor is required at the output from the mixer which is a preliminary stage for subsequent amplification. Secondly when modulation is very low band (10 kHz for example), it is highly sensitive to 1/f noise. In this case whatever the architecture of the mixing circuit (conventional or direct) it is necessary to optimize the 1/f noise from the mixer or mixers.

In practice the present invention relates to any signal mixer in which load resistors are necessary. In particular all mixers using micro-electronic transistors are concerned. In fact such mixers require load resistors to put the transistors into the operation area and achieve a current-voltage conversion. In particular mixers with a differential structure are covered by the invention: e.g. Gilbert. The mixers are used in signal processing equipment in which frequency translations are performed: cordless phone, DECT type phone, mobile phone, satellite receiver, TV receiver etc. The invention thus also relates to such signal processing devices, where the processing of the signal can be performed on reception, on transmission or at any time when necessary.

The Figures presented relate to particular embodiments of the invention. Although this invention has been described in accordance with the embodiments presented, an expert in the field will immediately recognize that there are variants of the embodiments presented and that these variants remain within the spirit and scope of the present invention. There are numerous ways to use the invention and numerous modifications can be performed by an expert without being excluded from the spirit and scope defined by the following claims.

The invention claimed is:

1. A mixing circuit for mixing a first signal with a second signal including a conversion stage to convert the first signal into a current, a mixing core to mix said current with the second signal, said mixing core being loaded via at least one load element, said circuit including noise optimization means, characterized in that the noise optimization means compensates for the contribution of the load element or elements to the noise inversely proportional to the frequency that is present in the output signal, wherein the load element includes a resistor used in transistor loading.

2. A mixing circuit as claimed in claim 1, characterized in that said noise optimization means include means to diminish the noise inversely proportional to frequency implemented in the load element or elements.

3. A mixing circuit as claimed in claim 2, characterized in that the load elements are selected from the elements of the group constituted by inductive resistors and silicon resistors.

4. A mixing circuit as claimed in claim 2, characterized in that at least one load element of the mixing core is a resistor with a size calculated to diminish the noise inversely proportional to frequency.

5. A mixing circuit as claimed in claim 4, characterized in that the load resistor is calculated such that the length-to-width ratio remains constant.

6. A mixing circuit as claimed in claim 1, characterized in that the difference between the frequency of the first signal and the frequency of the second signal is nil.

7. A mixing circuit as claimed in claim 1, characterized in that it has a differential structure.

8. A signal processing device including a signal mixing circuit as claimed in claim 1.

9. A telecommunication or radio communication system including a signal processing device as claimed in claim 8.

* * * * *